(12) United States Patent  (10) Patent No.: US 7,872,510 B2
Lee  (45) Date of Patent: Jan. 18, 2011

(54) DUTY CYCLE CORRECTION CIRCUIT OF SEMICONDUCTOR MEMORY APPARATUS

(75) Inventor: Seong-Jun Lee, Ichon (KR)

(73) Assignee: Hynix Semiconductor Inc. (KR)

( * ) Notice: Subject to any disclaimer, the term of this patent is extended or adjusted under 35 U.S.C. 154(b) by 193 days.

(21) Appl. No.: 12/346,683

(22) Filed: Dec. 30, 2008

(65) Prior Publication Data

US 2009/0302912 A1     Dec. 10, 2009

(30) Foreign Application Priority Data

Jun. 4, 2008    (KR) ...................... 10-2008-0052702

(51) Int. Cl.
H03K 3/017 (2006.01)
H03K 5/04 (2006.01)
H03K 7/08 (2006.01)
(52) U.S. Cl. ...................................... 327/176; 327/175
(58) Field of Classification Search .................. 327/175, 327/176
See application file for complete search history.

(56) References Cited

U.S. PATENT DOCUMENTS

2007/0090866 A1   4/2007   Park et al.

2009/0295446 A1*  12/2009  Yun et al. .................... 327/175

FOREIGN PATENT DOCUMENTS

| JP | 2007-124661 | 5/2007 |
| KR | 1020070046341 | 5/2007 |
| KR | 1020070104727 | 10/2007 |

\* cited by examiner

*Primary Examiner*—Lincoln Donovan
*Assistant Examiner*—Daniel Rojas
(74) *Attorney, Agent, or Firm*—Baker & McKenzie LLP

(57) ABSTRACT

A duty cycle correction circuit of a semiconductor memory apparatus includes a duty ratio correcting unit configured to correct a duty ratio of a clock signal according to levels of a first reference voltage and a second reference voltage, and to output the clock signal as a correction clock signal, a duty ratio detecting unit configured to count first and second counting signals in response to a duty ratio of the correction clock signal when a pump enable signal is enabled, a pump enable signal generating unit configured to generate the pump enable signal in response to the duty ratio of the correction clock signal, and a reference voltage generating unit configured to generate the first and second reference voltages in response to the first and second counting signals.

29 Claims, 5 Drawing Sheets

DUTY CYCLE CORRECTION CIRCUIT OF SEMICONDUCTOR MEMORY APPARATUS

CROSS-REFERENCE TO RELATED PATENT APPLICATION

The present application claims priority under 35 U.S.C 119(a) to Korean Application No. 10-2008-0052702, filed on Jun. 4, 2008, in the Korean Intellectual Property Office, which is incorporated herein by reference in its entirety as set forth in full.

BACKGROUND

1. Technical Field

The embodiments described herein relate to a semiconductor memory apparatus, and more particularly, to a duty cycle correction circuit.

2. Related Art

In general, double data rate synchronous dynamic random access memories (DDR SDRAMs) are configured to increase an operational speed by processing data using both a rising edge and a falling edge of a clock signal. However, if a duty ratio that is a ratio between a rising edge period and a falling edge period of the clock signal is not maintained at 50:50, operational efficiency is deteriorated. In actuality, a clock signal that is used in a semiconductor integrated circuit (IC) rarely has an accurate duty ratio due to various factors, such as noise within a mounting environment of the semiconductor IC. Thus, a semiconductor memory apparatus, such as the DDR SDRAM, includes a duty cycle correction device that corrects a duty ratio of a clock signal to improve operational efficiency.

A duty cycle correction circuit of a general semiconductor memory apparatus charges voltages during high-level and low-level periods of an input clock signal, compares levels of the charged voltages, and detects a duty ratio of the input clock signal. The semiconductor memory apparatus performs a control operation using the detection result, such that the high-level period and the low-level period of the input clock signal have the same length.

However, since a general duty cycle correction circuit continuously operates even when a high-level period and a low-level period of a clock signal are controlled to have the same length, current consumption is large. Thus, a duty cycle correction circuit having small current consumption has been required.

SUMMARY

A duty cycle correction circuit capable of reducing current consumption is described herein.

In one aspect, a duty cycle correction circuit of a semiconductor memory apparatus includes a duty ratio correcting unit configured to correct a duty ratio of a clock signal according to levels of a first reference voltage and a second reference voltage, and to output the clock signal as a correction clock signal, a duty ratio detecting unit configured to count first and second counting signals in response to a duty ratio of the correction clock signal when a pump enable signal is enabled, a pump enable signal generating unit configured to generate the pump enable signal in response to the duty ratio of the correction clock signal, and a reference voltage generating unit configured to generate the first and second reference voltages in response to the first and second counting signals.

In another aspect, a duty cycle correction circuit of a semiconductor memory apparatus includes a duty ratio correcting unit configured to correct a duty ratio of a clock signal according to a level of a reference voltage, and to output the clock signal as a correction clock signal, a duty ratio detecting unit configured to count counting signals in response to a duty ratio of the correction clock signal when a pump enable signal is enabled, a pump enable signal generating unit configured to generate the pump enable signal in response to the duty ratio of the correction clock signal, and a reference voltage generating unit configured to generate the reference voltage in response to the counting signals.

These and other features, aspects, and embodiments are described below in the section "Detailed Description."

BRIEF DESCRIPTION OF THE DRAWINGS

Features, aspects, and embodiments are described in conjunction with the attached drawings, in which.

DETAILED DESCRIPTION

Figure 1:
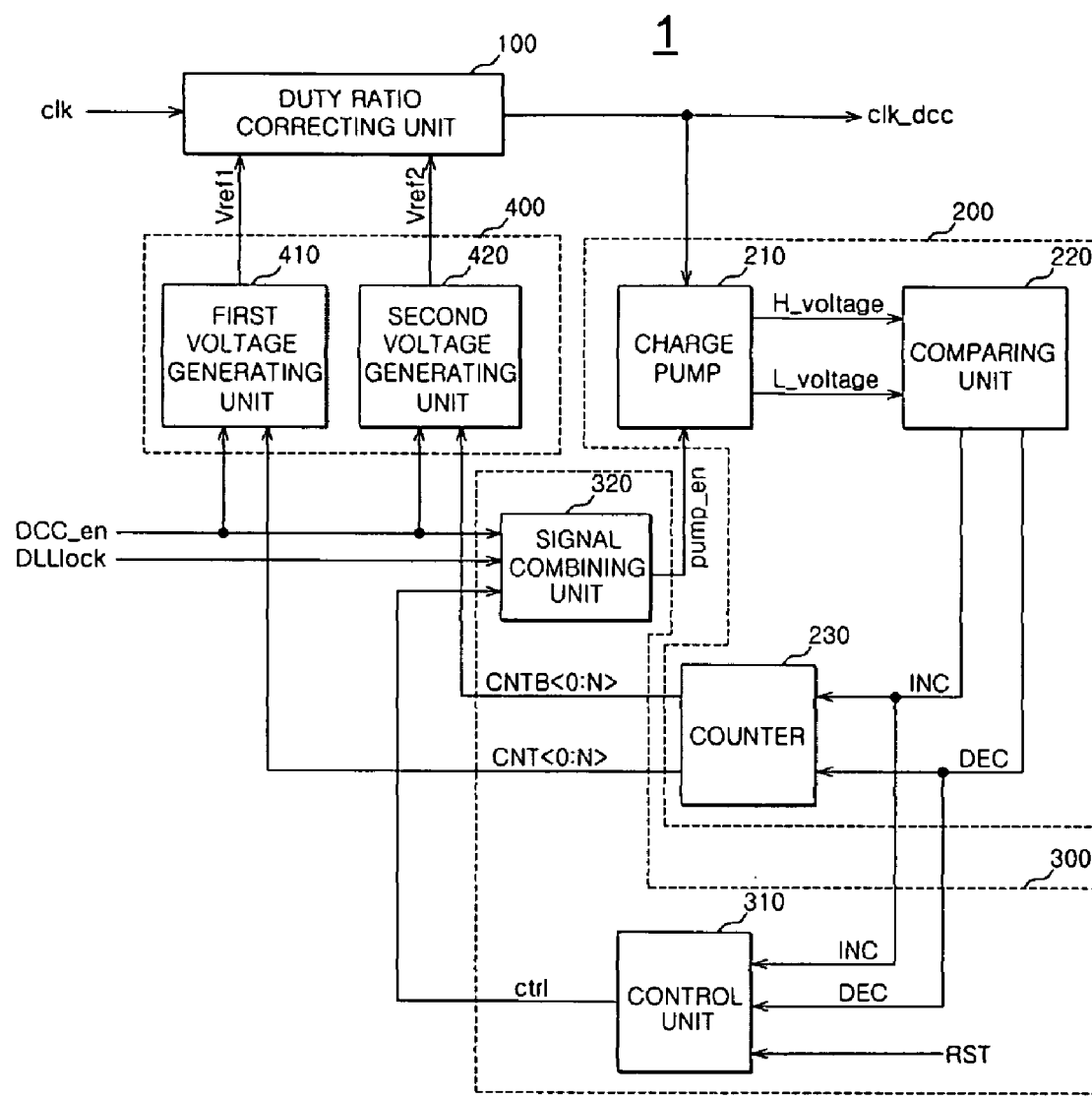
FIG. 1 is a schematic diagram of an exemplary duty cycle correction circuit of a semiconductor memory apparatus according to one embodiment.

FIG. 1 is a schematic diagram of an exemplary duty cycle correction circuit of a semiconductor memory apparatus according to one embodiment. In FIG. 1, a duty cycle correction circuit 1 of a semiconductor memory apparatus can be configured to include a duty ratio correcting unit 100, a duty ratio detecting unit 200, a pump enable signal generating unit 300, and a reference voltage generating unit 400.

The duty ratio correcting unit 100 can correct a duty ratio of a clock signal 'clk' according to levels of a first reference voltage Vref1 and a second reference voltage Vref2, and can output the clock signal as a correction clock signal 'clk_dcc'. For example, when the level of the first reference voltage Vref1 is lower than the level of the second reference voltage Vref2, the duty ratio correcting unit 100 can increase a high-level period of the clock signal 'clk' and decrease a low-level period thereof, and output the clock signal 'clk' as the correction clock signal 'clk_dcc'. When the level of the first reference voltage Vref1 is higher than the level of the second reference voltage Vref2, the duty ratio correcting unit 100 can decrease the high-level period of the clock signal 'clk' and increase the low-level period of the clock signal 'clk', and output the clock signal 'clk' as the correction clock signal 'clk_dcc'.

The duty ratio detecting unit 200 can count first counting signals 'CNT<0:N>' and second counting signals 'CNTB<0:N>' in response to a duty ratio of the correction clock signal 'clk_dcc', when a pump enable signal 'pump_en' is enabled. For example, the duty ratio detecting unit 200 can up-count the first counting signals 'CNT<0:N>' when a high-level period of the correction clock signal 'clk_dcc' is shorter than a low-level period thereof, and down-count the first counting signals 'CNT<0:N>' when the high-level period of the correction clock signal 'clk_dcc' is longer than the low-level period thereof. Here, the second counting signals 'CNTB<0:N>' can be down-counted when the first counting signals 'CNT<0:N>' are up-counted, and up-counted when the first counting signals 'CNT<0:N>' are down-counted.

The PUMP enable signal generating unit 300 can enable the PUMP enable signal 'pump_en' when an enable signal 'DCC_en' is enabled, and can disable the pump enable signal 'pump_en' when the length of the high-level period of the correction clock signal 'clk_dcc' becomes substantially equal to the length of the low-level period thereof.

The reference voltage generating unit 400 can generate the first and second reference voltages Vref1 and Vref2 in response to the first and second counting signals 'CNT<0:N>' and 'CNTB<0:N>'. For example, the reference voltage generating unit 400 can increase a level of the first reference voltage Vref1 when the first counting signals 'CNT<0:N>' are up-counted, and can decrease the level of the first reference voltage Vref1 when the first counting signals 'CNT<0:N>' are down-counted. The reference voltage generating unit 400 can increase a level of the second reference voltage Vref2 when the second counting signals 'CNTB<0:N>' are up-counted, and can decrease the level of the second reference voltage Vref2 when the second counting signals 'CNTB<0:N>' are down-counted.

The duty ratio detecting unit 200 can be configured to include a charge pump 210, a comparing unit 220, and a counter 230.

The charge pump 210 can be activated when the pump enable signal 'pump_en' is enabled. The activated charge pump 210 can charge a voltage during the high-level period of the correction clock signal 'clk_dcc' to generate a first charge voltage H_voltage, and can charge a voltage during the low-level period of the correction clock signal 'clk_dcc' to generate a second charge voltage L_voltage.

The comparing unit 220 can compare levels of the first and second charge voltages H_voltage and L_voltage, and can generate an increase signal 'INC' and a decrease signal 'DEC'. For example, the comparing unit 220 can enable the increase signal 'INC' when the level of the first charge voltage H_voltage is lower than the level of the second charge voltage L_voltage, and can enable the decrease signal 'DEC' when the level of the first charge voltage H_voltage is higher than the level of the second charge voltage L_voltage.

The counter 230 can up-count the first counting signals 'CNT<0:N>' when the increase signal 'INC' is enabled, and down-count the first counting signal 'CNT<0:N>' when the decrease signal 'DEC' is enabled. When the first counting signals 'CNT<0:N>' are up-counted, the second counting signals 'CNTB<0:N>' can be down-counted, and when the first counting signals 'CNT<0:N>' are down-counted, the second counting signals 'CNTB<0:N>' can be up-counted.

The pump enable signal generating unit 300 can be configured to include a control unit 310 and a signal combining unit 320.

The control unit 310 can generate the control signal 'ctrl' in response to the increase signal 'INC' and the decrease signal 'DEC'. For example, the control unit 310 can enable the control signal 'ctrl' when one of the increase signal 'INC' and the decrease signal 'DEC' is enabled and then the other is enabled. In addition, the control unit 310 can receive a periodically enabled reset signal 'RST' and disable the control signal 'ctrl'.

Figure 2:
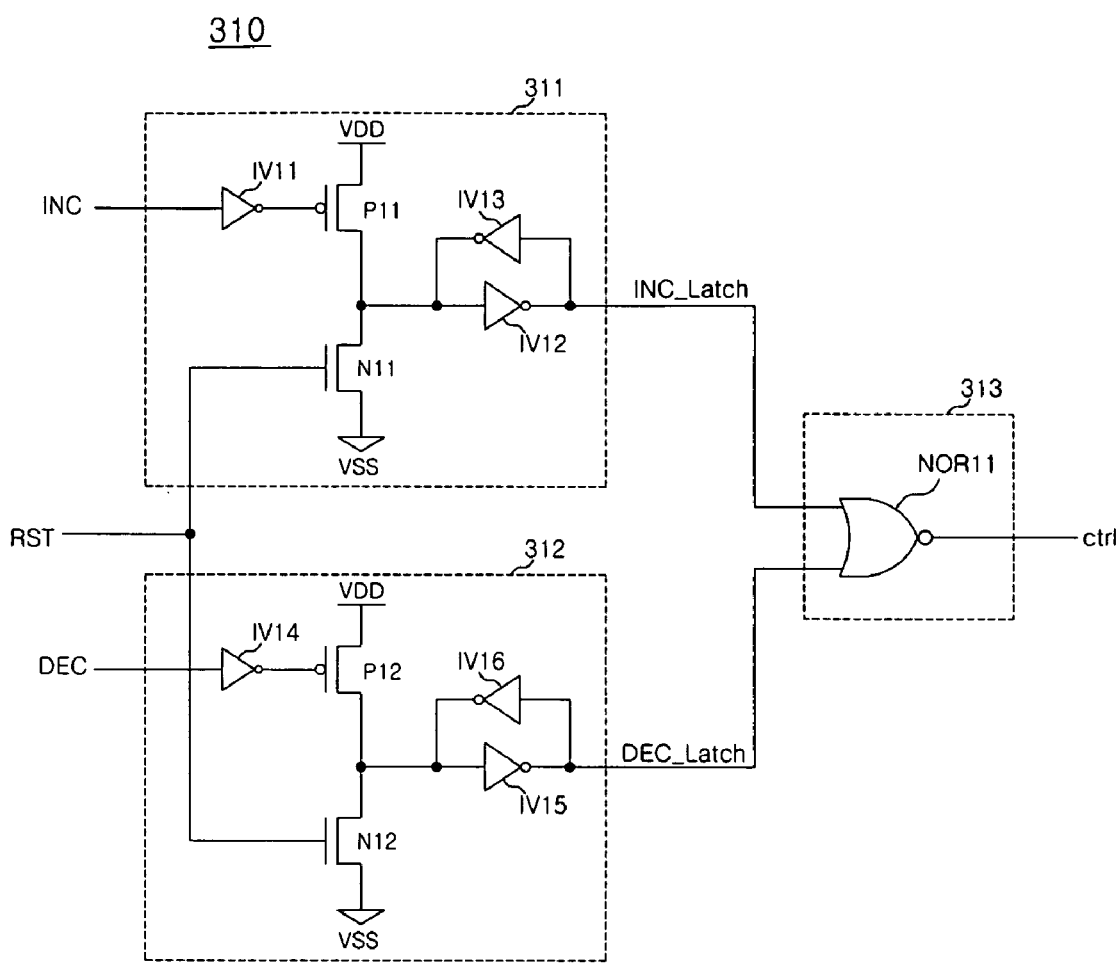
FIG. 2 is a schematic diagram of an exemplary control unit capable of being implemented in the apparatus of FIG. 1 according to one embodiment.

FIG. 2 is a schematic diagram of an exemplary control unit capable of being implemented in the apparatus of FIG. 1 according to one embodiment. In FIG. 2, the control unit 310 can be configured to include a first latch unit 311, a second latch unit 312, and a control signal generating unit 313.

The first latch unit 311 can store the increase signal 'INC' enabled at a high level and generate an increase latch signal 'INC_Latch' enabled at a low level. Meanwhile, the first latch unit 311 disables the increase latch signal 'INC_Latch' at a high level, when the reset signal 'RST' is enabled.

The first latch unit 311 can be configured to include first to third inverters IV11 to IV13 and first and second transistors P11 and N11. The first inverter IV11 can receive the increase signal 'INC'. The first transistor P11 can include a gate terminal receiving an output signal of the first inverter IV11 and a source terminal receiving an external voltage VDD. The second transistor N11 can include a gate terminal receiving the reset signal 'RST', a drain terminal connected to a drain terminal of the first transistor P11, and a source terminal connected to a ground terminal VSS.

In the second inverter IV12, a node to which the first and second transistors P11 and N11 are connected can be connected to an input terminal thereof, and the increase latch signal 'INC_Latch' can be output from an output terminal thereof. In the third inverter IV13, the output terminal of the second inverter IV12 can be connected to an input terminal thereof, and the input terminal of the second inverter IV12 can be connected to an output terminal thereof.

The second latch unit 312 can store the decrease signal 'DEC' that can be enabled at a high level, and can generate a decrease latch signal 'DEC_Latch' that can be enabled at a low level. In addition, the second latch unit 312 can disable the decrease latch signal 'DEC_Latch' at a high level when the reset signal 'RST' is enabled.

The second latch unit 312 can be configured to include fourth to sixth inverters IV14 to IV16 and third and fourth transistors P12 and N12. The fourth inverter IV14 can receive the decrease signal 'DEC'. The third transistor P12 can include a gate terminal receiving an output signal of the fourth inverter IV14 and a source terminal receiving the external voltage VDD. The fourth transistor N12 can include a gate terminal receiving the reset signal 'RST', a drain terminal connected a drain terminal of the third transistor P12, and a source terminal connected to a ground terminal VSS.

In the fifth inverter IV15, a node to which the third and fourth transistors P12 and N12 are connected can be connected to an input terminal thereof and the decrease latch signal 'DET_Latch' can be output from an output terminal thereof. In the sixth inverter IV16, the output terminal of the fifth inverter IV15 can be connected to an input terminal thereof and the input terminal of the fifth inverter IV15 can be connected to an output terminal thereof.

In addition, the first and second latch units 311 and 312 can be initialized by the reset signal 'RST'. The first and second latch units 311 and 312 can generate the output signals of the initialized first and second latch units 311 and 312, i.e., the first and second latch signals 'Latch1' and 'Latch2', at a high level.

The control signal generating unit 313 can enable the control signal 'ctrl' as a high level when the increase latch signal 'INC_Latch' and the decrease latch signal 'DEC_Latch' are generated at a low level. Accordingly, the control signal generating unit 313 can disable the control signal 'ctrl' at a low level when the increase latch signal 'INC_Latch' and the decrease latch signal 'DEC_Latch' are generated at a high level by the reset signal 'RST'. For example, the control signal generating unit 313 can be configured to include a NOR gate NOR11. The NOR gate NOR11 can receive the increase latch signal 'INC_Latch' and the decrease latch signal 'DEC_Latch' and generate the control signal 'ctrl'.

The signal combining unit 320 can generate the pump enable signal 'pump_en' that is enabled at a high level when the enable signal 'DCC_en' is enabled at a high level and the control signal 'ctrl' is disabled at a low level. In addition, the signal combining unit 320 can generate the pump enable signal 'pump_en' that is disabled at a low level when the enable signal 'DCC_en' is enabled at a high level and the control signal 'ctrl' is enabled at a high level. Accordingly, the signal combining unit 320 can further receive a DLL locked signal 'DLLlock' and generate the pump enable signal 'pump_en'. Thus, the signal combining unit 320 can generate the pump enable signal 'pump_en' that is disabled at a low level when all of the enable signal 'DCC_en', the control signal 'ctrl', and the DLL locked signal 'DLLlock' are enabled at a high level. Here, the DLL locked signal 'DLLlock' can be a signal that locks a DLL clock signal as an output signal of a delay locked loop (DLL) circuit, wherein the DLL locked signal 'DLLlock' can be generated when the operation of the DLL circuit is stabilized.

Figure 3:
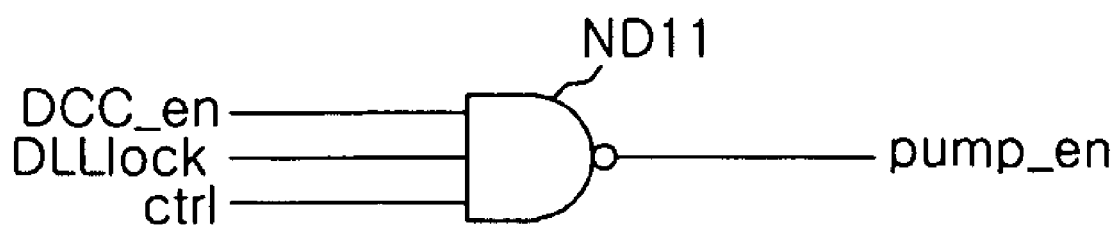
FIG. 3 is a schematic diagram of an exemplary signal combining unit capable of being implemented in the apparatus of FIG. 1 according to one embodiment.

FIG. 3 is a schematic diagram of an exemplary signal combining unit capable of being implemented in the apparatus of FIG. 1 according to one embodiment. In FIG. 3, the signal combining unit 320 can be configured to include a NAND gate ND11. The NAND gate ND11 can receive the enable signal 'DCC_en', the DLL locked signal 'DLLlock', and the control signal 'ctrl', and can generate the pump enable signal 'pump_en'.

The reference voltage generating unit 400 can be configured to include first and second voltage generating units 410 and 420. The first voltage generating unit 410 can generate the first reference voltage Vref1 in response to the first counting signals 'CNT<0:N>'. The second voltage generating unit 420 can generate the second reference voltage Vref2 in response to the second counting signal '<CNTB<0: N>'.

The first voltage generating unit 410 can increase the level of the first reference voltage Vref1 when the first counting signals 'CNT<0:N>' are up-counted, and decrease the level of the first reference voltage Vref1 when the first counting signals 'CNT<0:N>' are down-counted. The second voltage generating unit 420 can increase the level of the second reference voltage Vref2 when the second counting signals 'CNTB<0:N>' are up-counted, and decrease the level of the second reference voltage Vref2 when the second counting signals 'CNTB<0:N>' are down-counted.

An exemplary operation of the duty cycle correction circuit 1 of the semiconductor memory apparatus will be described with reference to FIG. 1.

When the enable signal 'DCC_en' is enabled at a high level, the first and second voltage generating units 410 and 420 can generate the first and second reference voltages Vref1 and Vref2 having predetermined levels. Accordingly, the signal combining unit 320 can receive the enable signal 'DCC_en' that is enabled at a high level and the control signal 'ctrl' that is disabled at a low level and generate the pump enable signal 'pump_en' that is enabled at a high level.

The duty ratio correcting unit 100 can correct a duty ratio of the clock signal 'clk' according to the levels of the first and second reference voltages Vref1 and Vref2 and output the clock signal as the correction clock signal 'clk_dcc'.

The charge pump 210 can be activated by receiving the pump enable signal 'pump_en' that is enabled at a high level. The activated charge pump 210 can charge a voltage during a high-level period of the correction clock signal 'clk_dcc' and output the voltage as a first charge voltage H_voltage, and charge a voltage during a low-level period of the correction clock signal 'clk_dcc' and output the voltage as a second charge voltage L_voltage. For example, when the high-level period of the correction clock signal 'clk_dcc' is shorter than the low-level period thereof, the first charge voltage H_voltage can be generated to have a level lower than a level of the second charge voltage L_voltage. When the high-level period of the correction clock signal 'clk_dcc' is longer than the low-level period thereof, the first charge voltage H_voltage can be generated to have a level higher than a level of the second charge voltage L_voltage.

The comparing unit 220 enables the increase signal 'INC' at a high level when the level of the first charge voltage H_voltage is lower than the level of the second charge voltage L_voltage. Furthermore, the comparing unit 220 enables the decrease signal 'DEC' at a high level, when the level of the first charge voltage H_voltage is higher than the level of the second charge voltage L_voltage.

When the increase signal 'INC' is enabled, the counter 230 can up-count the first counting signals 'CNT<0:N>' and down-count the second counting signals 'CNTB<0:N>'. Meanwhile, when the decrease signal 'DEC' is enabled, the counter 230 can down-count the first counting signals 'CNT<0:N>' and up-count the second counting signal 'CNTB<0:N>'.

The first voltage generating unit 410 can increase the level of the first reference voltage Vref1 when the first counting signals 'CNT<0:N>' are up-counted. Meanwhile, the first voltage generating unit 410 can decrease the level of the first reference voltage 'Vref1' when the first counting signals 'CNT<0:N>' are down-counted. The second voltage generating unit 420 can increase the level of the second reference voltage Vref2 when the second counting signals 'CNTB<0: N>' are up-counted. In addition, the second voltage generating unit 420 can decrease the level of the second reference voltage Vref2 when the second counting signals 'CNTB<0: N>' are down-counted.

When the level of the first reference voltage Vref1 increases and the level of the second reference voltage Vref2 decreases, the duty ratio correcting unit 100 can increase the high-level period of the clock signal 'clk' and decrease the low-level period of the clock signal 'clk', and output the clock signal 'clk' as the correction clock signal 'clk_dcc'. Meanwhile, when the level of the first reference voltage Vref1 decreases and the level of the second reference voltage Vref2 increases, the duty ratio correcting unit 100 can decrease the high-level period of the clock signal 'clk' and increase the low-level period of the clock signal 'clk' and output the clock signal as the correction clock signal 'clk_dcc'.

The control unit 310 enables the control signal 'ctrl' at timing when the increases signal 'INC' is enabled and then the decrease signal 'DEC' is enabled. Meanwhile, the control units 310 also enables the control signal 'ctrl' at timing when the decrease signal 'DEC' is enabled and then the increase signal 'INC' is enabled.

In a state where the enable signal 'DCC_en' is enabled, when the control signal 'ctrl' is enabled, the signal combining unit 320 disables the pump enable signal 'pump_en'. When the pump enable signal 'pump_en' is disabled, the charge pump 210 can be inactivated and cannot generate the first and second charge voltages H_voltage and L_voltage. Accordingly, the increase signal 'INC' and the decrease signal 'DEC' cannot be generated. The counter 230 can output the first and second counting signals 'CNT<0:N>' and 'CNTB<0:N>' before the pump enable signal 'pump_en' is disabled. That is, the counter 230 can stop a counting operation. The levels of the first and second reference voltages Vref1 and Vref2 can be locked. That is, the lengths of the high-level and low-level periods of the correction clock signal 'clk_dcc' can be locked.

When the reset signal 'RST' that is input to the control unit 310 is periodically enabled, the control unit 310 disables the control signal 'ctrl' whenever the reset signal 'RST' is enabled. Accordingly, the pump enable signal 'pump_en' is periodically enabled and disabled. Accordingly, the duty ratio detecting unit 200 can repeat the operation of periodically performing and stopping the duty ratio detection. When the DLL locked signal 'DLLlock' is additionally input to the signal combining unit 320, the pump enable signal 'pump_en' is disabled after the DLL locked signal 'DLLlock' is enabled. Accordingly, the duty cycle correction circuit can stop the operation of detecting a duty ratio after the DLL circuit is stabilized. As a result, it is possible to improve operational stability of the duty cycle correction circuit.

The duty cycle correction circuit 1 can stop a comparison operation of the duty ratio of the correction clock signal 'clk_dcc' at timing when the high-level period of the correction clock signal 'clk_dcc' becomes longer than the low-level period thereof. Alternatively, the duty cycle correction circuit 1 can stop a comparison operation of the duty ratio of the correction clock signal 'clk_dcc' at timing when the high-level period of the correction clock signal 'clk_dcc' becomes shorter than the low-level period thereof. Accordingly, power consumption can be reduced in the duty cycle correction circuit 1.

Figure 4:
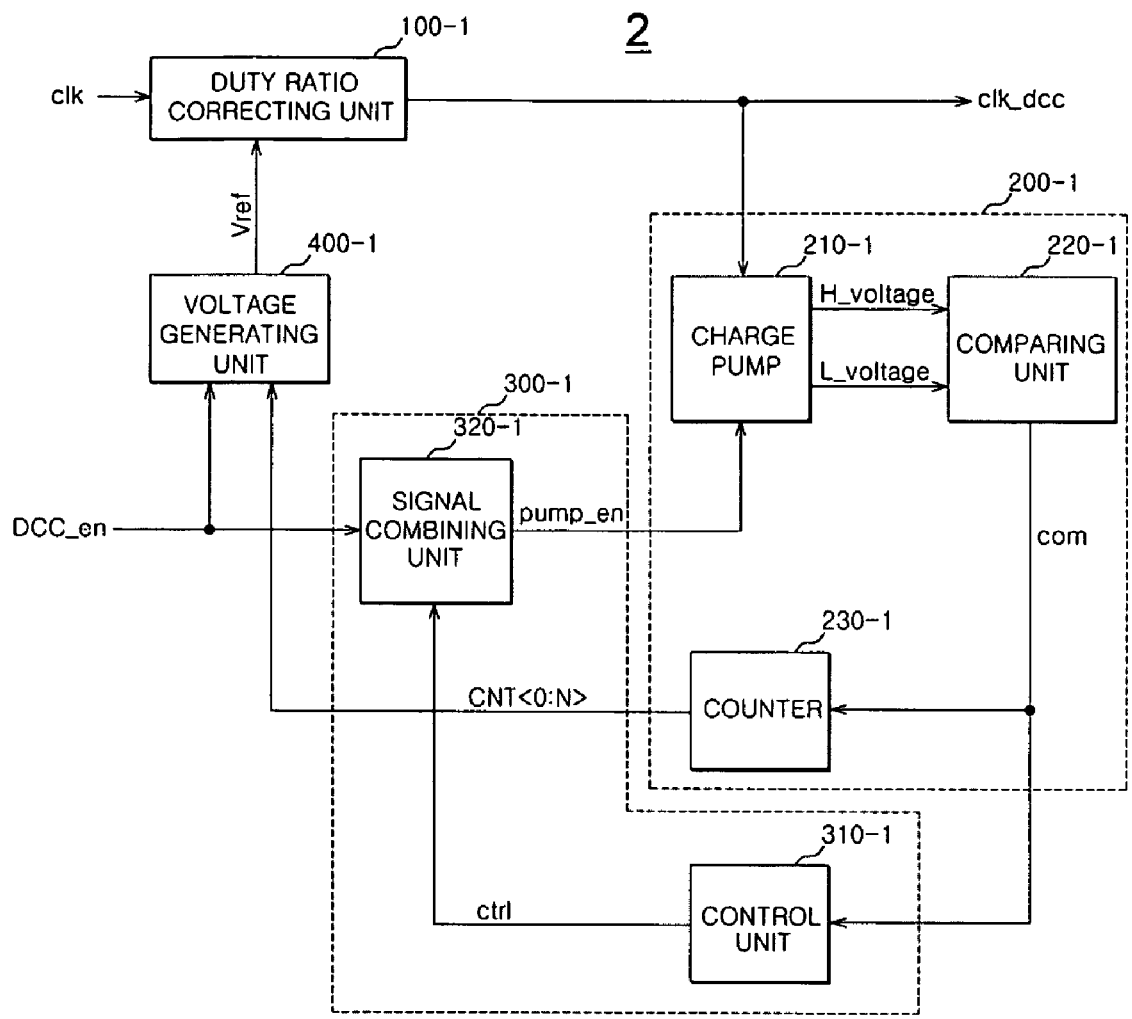
FIG. 4 is a schematic diagram of another exemplary duty cycle correction circuit of an exemplary semiconductor memory apparatus according to another embodiment.

FIG. 4 is a schematic diagram of another exemplary duty cycle correction circuit of an exemplary semiconductor memory apparatus according to another embodiment. In FIG. 4, a duty cycle correction circuit 2 of a semiconductor memory apparatus can be configured to include a duty ratio correcting unit 100-1, a duty ratio detecting unit 200-1, a pump enable signal generating unit 300-1, and a voltage generating unit 400-1.

In FIG. 4, when the level of the reference voltage Vref increases, the duty ratio correcting unit 100-1 can increase a high-level period of the clock signal 'clk' and decreases a low-level period thereof, and can output the clock signal as the correction clock signal 'clk_dcc'. When the level of the reference voltage Vref decreases, the duty ratio correcting unit 100-1 can decrease the high-level period of the clock signal 'clk' and increase the low-level period thereof, and can output the clock signal as the correction clock signal 'clk_dcc'.

The duty ratio detecting unit 200-1 can be activated when the pump enable signal 'pump_en' is enabled, and can count the counting signals 'CNT<0:N>' in response to the duty ratio of the correction clock signal 'clk_dcc'. For example, the duty ratio detecting unit 200-1 can be configured to include a charge pump 210-1, a comparing unit 220-1, and a counter 230-1.

When the pump enable signal 'pump_en' is enabled, the charge pump 210-1 can charge a voltage during a high-level period of the correction clock signal 'clk_dcc' to generate a first charge voltage H_voltage, and can charge a voltage during a low-level period of the correction clock signal 'clk_dcc' to generate a second charge voltage L_voltage.

The comparing unit 220-1 can output a comparison signal 'com' that is enabled at a high level when the level of the first charge voltage H_voltage is lower than the level of the second charge voltage L_voltage, and can output the comparison signal 'com' that is disabled at a low level when the level of the first charge voltage H_voltage is higher than the level of the second charge voltage L_voltage.

The counter 230-1 can up-count the counting signals 'CNT<0:N>' when the comparison signal 'com' is enabled, and down-count the counting signals 'CNT<0:N>' when the comparison signal 'com' is disabled.

The pump enable signal generating unit 300-1 can disable the pump enable signal 'pump_en' when the comparison signal 'com' is enabled and then disabled or disabled and then enabled. For example, the pump enable signal generating unit 300-1 can be configured to include a control unit 310-1 and a signal combining unit 320-1.

The control unit 310-1 can enable the control signal 'ctrl' at a high level when the comparison signal 'com' is enabled at a high level, and then disabled at a low level. The pump enable signal generating unit 300-1 can enable the control signal 'ctrl' at a high level when the comparison signal 'com' is disabled at a low level, and then enabled at a high level.

Figure 5:
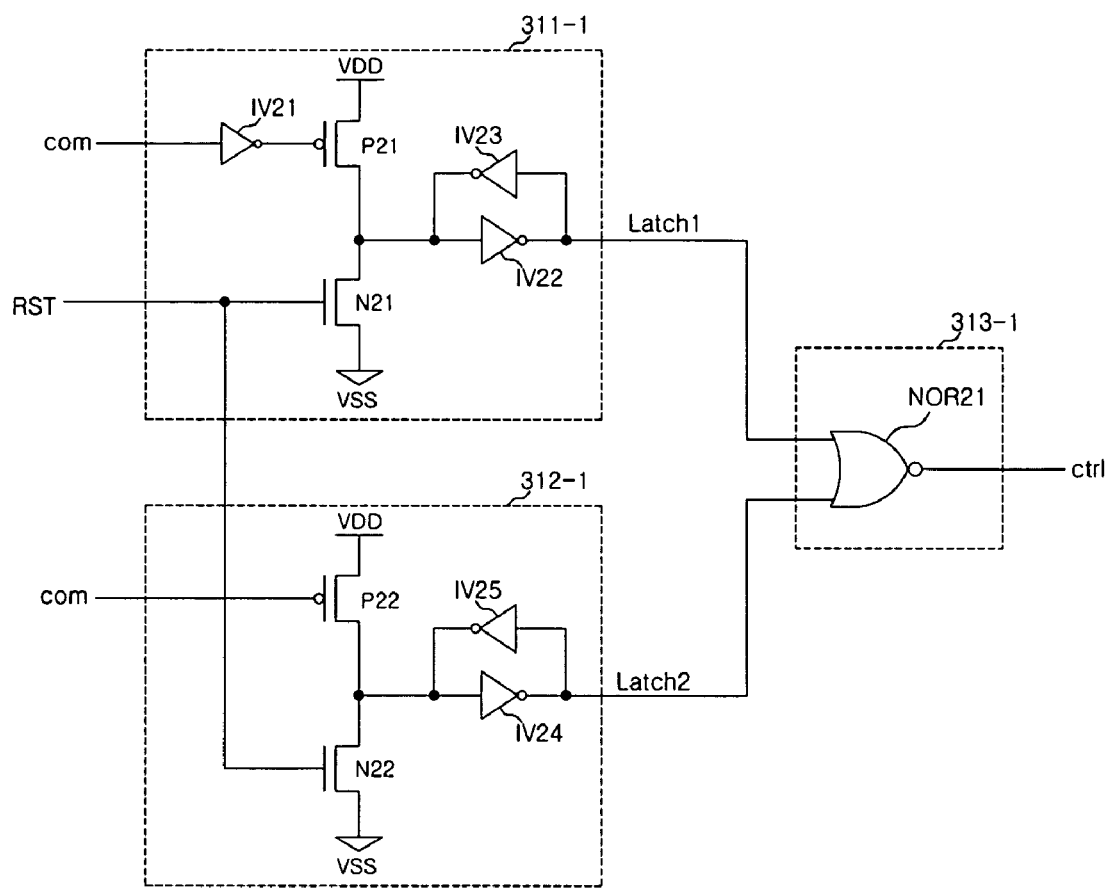
FIG. 5 is a schematic diagram of an exemplary control unit capable of being implemented in the apparatus of FIG. 4 according to another embodiment.

FIG. 5 is a schematic diagram of an exemplary control unit capable of being implemented in the apparatus of FIG. 4 according to another embodiment. In FIG. 5, the control unit 310-1 can be configured to include a first latch unit 311-1, a second latch unit 312-1, and a control signal generating unit 313-1.

The first latch unit 311-1 can generate a first latch signal 'Latch1' at a low level when the comparison signal 'com' is enabled at a high level, the second latch unit 312-1 can generate a second latch signal 'Latch2' at a low level when the comparison signal 'com' is disabled at a low level, and the control signal generating unit 313-1 can generate the control signal 'ctrl' that is enabled at a high level when the first and second latch signals 'Latch1' and 'Latch2' are generated. Accordingly, the first and second latch units 311-1 and 312-1 can be initialized by a reset signal 'RST'. The first and second latch units 311-1 and 312-1 can generate the output signals of the initialized first and second latch units 311-1 and 312-1, that is, the first and second latch signals 'Latch1' and 'Latch2' at a high level.

The signal combining unit 320-1 can disable the pump enable signal 'pump_en' when the enable signal 'DCC_en' and the control signal 'ctrl' are enabled. For example, the signal combining unit 320-1 can be configured as shown in FIG. 4. The signal combining unit 320-1 can be configured to include a NAND gate ND11. The NAND gate ND11 can receive the enable signal 'DCC_en' and the control signal 'ctrl', and can output the pump enable signal 'pump_en'.

In FIG. 4, the voltage generating unit 400-1 can increase a level of the reference voltage 'Vref' when the counting signals 'CNT<0:N>' are up-counted, and can decrease the level of the reference voltage 'Vref' when the counting signals 'CNT<0:N>' are down-counted.

Another exemplary operation of the duty cycle correction circuit 2 of the semiconductor memory apparatus will be described with reference to FIG. 4.

The duty ratio correcting unit 100-1 can correct the clock signal 'clk' according to the level of the reference voltage 'Vref', and can output the clock signal 'clk' as the correction clock signal 'clk_dcc'.

When the high-level period of the correction clock signal 'clk_dcc' is shorter than the low-level period thereof, the charge pump 210-1 can output the first charge voltage H_voltage having a level lower than a level of the second charge voltage L_voltage.

The comparing unit 220-1 can generate an enabled comparison signal 'com' since the level of the first charge voltage H_voltage is lower than the level of the second charge voltage L_voltage. In addition, the counter 230-1 can receive the enabled comparison signal 'com' and up-count the counting signals 'CNT<0:N>'. The voltage generating unit 400-1 can increase the level of the reference voltage 'Vref' when the counting signals 'CNT<0:N>' are up-counted.

The duty ratio correcting unit 100-1 can increase the high-level period of the correction clock signal 'clk_dcc' and decrease the low-level period thereof. When the high-level period of the correction clock signal 'clk_dcc' is longer than the low-level period thereof, the charge pump 210-1 can generate the first charge voltage H_voltage that has a level higher than the level of the second charge voltage L_voltage. The comparing unit 220-1 can generate the comparison signal 'com' that is disabled when the level of the first charge voltage H_voltage is higher than the level of the second charge voltage L_voltage.

The control unit 310-1 can enable the control signal 'ctrl' at timing when the comparison signal 'com' is enabled and then disabled, and the signal combining unit 320-1 can disable the pump enable signal 'pump_en' when the control signal 'ctrl' is enabled.

Accordingly, since the charge pump 210-1 can stop the operation of generating the first and second charge voltages H_voltage and L_voltage, the counter 230-1 can stop the operation of counting the counting signals 'CNT<0:N>'. Since the counter 230-1 can output the locked counting signals 'CNT<0:N>', the voltage generating unit 400-1 can output the reference voltage Vref having a constant level. As a result, in the duty ratio correcting unit 100-1, the lengths of the high-level and low-level periods of the correction clock signal 'clk_dcc' can be locked.

The duty cycle correction circuit 2 can stop the comparison operation of a duty ratio of the correction clock signal 'clk_dcc' at timing when the high-level period of the correction clock signal 'clk_dcc' becomes longer than the low-level period thereof. Alternatively, the duty cycle correction circuit 2 can stop the comparison operation of the duty ratio of the correction clock signal 'clk_dcc' at timing when the high-level period of the correction clock signal 'clk_dcc' becomes shorter than the low-level period thereof. Accordingly, power consumption can be reduced in the duty cycle correction circuit 2.

While certain embodiments have been described above, it will be understood that the embodiments described are by way of example only. Accordingly, the device and methods described herein should not be limited based on the described embodiments. Rather, the device and methods described herein should only be limited in light of the claims that follow when taken in conjunction with the above description and accompanying drawings.

What is claimed is:

1. A duty cycle correction circuit of a semiconductor memory apparatus, comprising:
    a duty ratio correcting unit configured to correct a duty ratio of a clock signal according to levels of a first reference voltage and a second reference voltage, and to output the clock signal as a correction clock signal;
    a duty ratio detecting unit configured to generate first and second counting signals by detecting a duty ratio of the correction clock signal when a pump enable signal is enabled;
    a pump enable signal generating unit configured to generate the pump enable signal in response to the duty ratio of the correction clock signal; and
    a reference voltage generating unit configured to generate the first and second reference voltages in response to the first and second counting signals.

2. The duty cycle correction circuit of claim 1, wherein the duty ratio correcting unit is configured to increase a high-level period of the clock signal and to decrease a low-level period of the clock signal when a level of the first reference voltage is higher than a level of the second reference voltage.

3. The duty cycle correction circuit of claim 2, wherein the duty ratio correcting unit is configured to decrease the high-level period of the clock signal and to increase the low-level period of the clock signal when the level of the first reference voltage is lower than the level of the second reference voltage.

4. The duty cycle correction circuit of claim 1, wherein the duty ratio detecting unit is configured to stop counting of the first and second counting signals when the length of the high-level period of the correction clock signal is the same as the length of the low-level period thereof.

5. The duty cycle correction circuit of claim 4, wherein the duty ratio detecting unit is configured to count the first and second counting signals when the length of the high-level period of the correction clock signal is different from the length of the low-level period thereof.

6. The duty cycle correction circuit of claim 5, wherein the second counting signals are configured to be down-counted when the first counting signals are up-counted and up-counted when the first counting signals are down-counted.

7. The duty cycle correction circuit of claim 6, wherein the duty ratio detecting unit includes:
    a charge pump configured to charge a voltage during the high-level period of the correction clock signal to generate a first charge voltage and to charge a voltage during the low-level period of the correction clock signal to generate a second charge voltage when the charge pump is activated by a control signal;
    a comparing unit configured to compare levels of the first and second charge voltages and to generate an increase signal and a decrease signal; and
    a counter configured to generate the first and second counting signals in response to the increase signal and the decrease signal.

8. The duty cycle correction circuit of claim 6, wherein the comparing unit is configured to enable the increase signal when the level of the first charge voltage is lower than the level of the second charge voltage and to enable the decrease signal when the level of the first charge voltage is higher than the level of the second charge voltage.

9. The duty cycle correction circuit of claim 8, wherein the pump enable signal generating unit is configured to disable the pump enable signal when one of the increase signal and the decrease signal is enabled and then the other of the increase signal and the decrease signal is enabled.

10. The duty cycle correction circuit of claim 9, wherein the pump enable signal generating unit includes:
    a first latch unit configured to store the enabled increase signal to generate an increase latch signal;
    a second latch unit configured to store the enabled decrease signal to generate a decrease latch signal;
    a control signal generating unit configured to enable the control signal when the increase latch signal and the decrease latch signal are generated; and
    a signal combining unit configured to disable the pump enable signal when the enabled signal and the control signal are enabled.

11. The duty cycle correction circuit of claim 10, wherein the first and second latch units are configured to initialize the increase latch signal and the decrease latch signal by disabling all of the stored enable levels of the increase signal and the decrease signal in response to a reset signal.

12. The duty cycle correction circuit of claim 11, wherein the reset signal is configured to be periodically enabled.

13. The duty cycle correction circuit of claim 6, wherein the counter is configured to up-count the first counting signals and down-count the second counting signals when the increase signal is enabled.

14. The duty cycle correction circuit of claim 13, wherein the counter is configured to down-count the first counting signals and up-count the second counting signals when the decrease signal is enabled.

15. The duty cycle correction circuit of claim 1, wherein the reference voltage generating unit includes:
- a first voltage generating unit configured to generate the first reference voltage in response to the first counting signals; and
- a second voltage generating unit configured to generate the second reference voltage in response to the second counting signals.

16. The duty cycle correction circuit of claim 15, wherein the first voltage generating unit is configured to increase the level of the first reference voltage when the first counting signals are up-counted and decrease the level of the first reference voltage when the first counting signals are down-counted.

17. The duty cycle correction circuit of claim 15, wherein the second voltage generating unit is configured to increase the level of the second reference voltage when the second counting signals is up-counted and decrease the level of the second reference voltage when the second counting signals are down-counted.

18. A duty cycle correction circuit of a semiconductor memory apparatus, comprising:
- a duty ratio correcting unit configured to correct a duty ratio of a clock signal according to a level of a reference voltage, and to output the clock signal as a correction clock signal;
- a duty ratio detecting unit configured to count counting signals in response to a duty ratio of the correction clock signal when a pump enable signal is enabled;
- a pump enable signal generating unit configured to generate the pump enable signal having a function for controlling a charge pump in response to the duty ratio of the correction clock signal; and
- a reference voltage generating unit configured to generate the reference voltage in response to the counting signals.

19. The duty cycle correction circuit of claim 18, wherein the duty ratio correcting unit is configured to increase a high-level period of the clock signal and decrease a low-level period of the clock signal when a level of the reference voltage becomes low.

20. The duty cycle correction circuit of claim 19, wherein the duty ratio correcting unit is configured decrease the high-level period of the clock signal and increase the low-level period of the clock signal when the level of the reference voltage becomes high.

21. The duty cycle correction circuit of claim 18, wherein the duty ratio detecting unit is configured to up-count the counting signals by enabling a comparison signal when the high-level period of the correction clock signal is shorter than the low-level period thereof, and to down-count the counting signals by disabling the comparison signal when the high-level period of the correction clock signal is longer than the low-level period thereof.

22. The duty cycle correction circuit of claim 21, wherein the charge pump is included in the duty ratio detecting unit, and the charge pump is configured to charge a voltage during the high-level period of the correction clock signal to generate a first charge voltage, and to charge a voltage during the low-level period of the correction clock signal to generate a second charge voltage when the charge pump is activated by the pump enable signal, and
wherein the duty ratio detecting unit includes:
- a comparing unit configured to compare levels of the first and second charge voltages and generate the comparison signal; and
- a counter configured to count the counting signals in response to the comparison signal.

23. The duty cycle correction circuit of claim 22, wherein the comparing unit is configured to enable the comparison signal when the level of the first charge voltage is lower than the level of the second charge voltage, and to disable the comparison signal when the level of the first charge voltage is higher than the level of the second charge voltage.

24. The duty cycle correction circuit of claim 22, wherein the counter is configured to up-count the counting signals when the comparison signal is enabled, and to down-count the counting signals when the comparison signal is disabled.

25. The duty cycle correction circuit of claim 18, wherein the pump enable signal generating unit is configured to disable the pump enable signal at timing when the high-level period of the correction clock signal becomes longer than the low-level period thereof or timing when the high-level period of the correction clock signal becomes shorter than the low-level period thereof.

26. The duty cycle correction circuit of claim 25, wherein the duty ratio detecting unit is configured to generate an enabled comparison signal when the high-level period of the correction clock signal is shorter than the low-level period thereof, and to generate a disabled comparison signal when the high-level period of the correction clock signal is longer than the low-level period thereof.

27. The duty cycle correction circuit of claim 26, wherein the duty the pump enable signal generating unit is configured to disable the pump enable signal when the comparison signal is enabled and then disabled, and when the comparison signal is disabled and then enabled.

28. The duty cycle correction circuit of claim 27, wherein the pump enable signal generating unit includes:
- a first latch unit configured to store the enabled comparison signal to generate a first latch signal;
- a second latch unit configured to store the disabled comparison signal to generate a second latch signal;
- a control signal generating unit configured to enable the control signal when the first and second latch signals are generated; and
- a signal combining unit configured to disable the pump enable signal when the enabled signal and the control signal are enabled.

29. The duty cycle correction circuit of claim 18, wherein the reference voltage generating unit is configured to increase the level of the reference voltage when the counting signals are up-counted, and to decrease the level of the reference voltage when the counting signals are down-counted.

* * * * *